(12) United States Patent
Morris, III et al.

(10) Patent No.: US 10,325,727 B2
(45) Date of Patent: Jun. 18, 2019

(54) FLEXIBLE CONTROL SYSTEMS AND METHODS FOR DEVICE ARRAYS

(71) Applicant: wiSpry, Inc., Irvine, CA (US)

(72) Inventors: Arthur S. Morris, III, Lakewood, CO (US); Christophe Masse, Irvine, CA (US); Peter Maimone, Orange, CA (US); John Slaton McKillop, Chandler, AZ (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 15/898,193

(22) Filed: Feb. 15, 2018

(65) Prior Publication Data

US 2018/0308640 A1    Oct. 25, 2018

Related U.S. Application Data

(60) Provisional application No. 62/459,575, filed on Feb. 15, 2017.

(51) Int. Cl.
| | |
|---|---|
| *H01G 5/38* | (2006.01) |
| *H01G 7/00* | (2006.01) |
| *G11C 16/06* | (2006.01) |
| *G11C 17/18* | (2006.01) |

(Continued)

(52) U.S. Cl.
CPC .............. *H01G 5/38* (2013.01); *G11C 16/06* (2013.01); *G11C 17/18* (2013.01); *H01G 5/16* (2013.01); *H01G 5/40* (2013.01); *H01G 7/00* (2013.01)

(58) Field of Classification Search
None
See application file for complete search history.

(56) References Cited

U.S. PATENT DOCUMENTS

| | | | | |
|---|---|---|---|---|
| 8,773,193 B2* | 7/2014 | Morris, III | ........... | H03H 19/004 |
| | | | | 327/337 |
| 9,584,097 B2* | 2/2017 | Bakalski | ................. | H03J 5/244 |
| 9,947,994 B2* | 4/2018 | Suh | ........................ | H04B 1/006 |

(Continued)

FOREIGN PATENT DOCUMENTS

WO    WO 2018/152379 A1    8/2018

OTHER PUBLICATIONS

International Search Report and Written Opinion for Application No. PCT/US2018/018453 dated May 29, 2018.

*Primary Examiner* — Jeffery S Zweizig
(74) *Attorney, Agent, or Firm* — Jenkins, Wilson, Taylor & Hunt, P.A.

(57) ABSTRACT

The present subject matter relates to devices, systems, and methods for controlling an array of two-state elements that can be independently positioned in either first state or a second state. A non-volatile memory in communication with the plurality of two-state elements is configured to receive an input digital control word that addresses a location within the non-volatile memory and to output one of a plurality of array control words stored at the location addressed within the memory to the plurality of two-state elements, wherein the array control word sets a predetermined combination of the plurality of two-state elements to be in the first state and in the second state, and wherein the predetermined combination of the plurality of two-state elements in the first state and in the second state optimally achieves a desired behavior of the array corresponding to the input digital control word.

13 Claims, 8 Drawing Sheets

(51) Int. Cl.
*H01G 5/16* (2006.01)
*H01G 5/40* (2006.01)

(56) References Cited

U.S. PATENT DOCUMENTS

| | | |
|---|---|---|
| 2008/0094149 A1* | 4/2008 | Brobston .................. H03H 7/40 333/17.3 |
| 2011/0316654 A1 | 12/2011 | Meng et al. |
| 2012/0286888 A1* | 11/2012 | Hsieh .................... H03B 5/1228 331/117 FE |
| 2014/0009248 A1 | 1/2014 | Granger-Jones |
| 2014/0015589 A1 | 1/2014 | Morris |
| 2015/0131197 A1 | 5/2015 | Morris et al. |
| 2015/0310995 A1 | 10/2015 | Ranta |

* cited by examiner

| Input Control Words | | | | | | | | | | | | | | | | | |
|---|---|---|---|---|---|---|---|---|---|---|---|---|---|---|---|---|---|
| | | 0 | 0 | 0 | 0 | 0 | 0 | 0 | 0 | 1 | 1 | 1 | 1 | 1 | 1 | 1 | 1 |
| | | 0 | 0 | 0 | 0 | 1 | 1 | 1 | 1 | 0 | 0 | 0 | 0 | 1 | 1 | 1 | 1 |
| | | 0 | 0 | 1 | 1 | 0 | 0 | 1 | 1 | 0 | 0 | 1 | 1 | 0 | 0 | 1 | 1 |
| | | 0 | 1 | 0 | 1 | 0 | 1 | 0 | 1 | 0 | 1 | 0 | 1 | 0 | 1 | 0 | 1 |
| | Target Value | 0.00 | 0.50 | 1.00 | 1.50 | 2.00 | 2.50 | 3.00 | 3.50 | 4.00 | 4.50 | 5.00 | 5.50 | 6.00 | 6.50 | 7.00 | 7.50 |
| Device | Measured value | | | | | Calibration Words | | | | | | | | | | | |
| 1 | 1.00 | 0 | 0 | 0 | 0 | 0 | 0 | 0 | 1 | 0 | 1 | 0 | 1 | 1 | 1 | 1 | 1 |
| 2 | 0.90 | 0 | 0 | 0 | 0 | 0 | 1 | 0 | 0 | 0 | 0 | 1 | 1 | 0 | 0 | 1 | 1 |
| 3 | 1.05 | 0 | 0 | 0 | 0 | 1 | 0 | 1 | 1 | 1 | 0 | 1 | 0 | 1 | 0 | 1 | 1 |
| 4 | 1.10 | 0 | 0 | 0 | 0 | 0 | 0 | 1 | 0 | 0 | 0 | 0 | 0 | 1 | 0 | 0 | 0 |
| 5 | 0.85 | 0 | 0 | 0 | 1 | 0 | 0 | 0 | 1 | 1 | 0 | 0 | 1 | 0 | 0 | 1 | 1 |
| 6 | 0.90 | 0 | 0 | 0 | 0 | 0 | 1 | 0 | 0 | 0 | 1 | 1 | 0 | 1 | 1 | 0 | 1 |
| 7 | 1.00 | 0 | 0 | 0 | 0 | 0 | 0 | 0 | 1 | 1 | 0 | 1 | 1 | 0 | 1 | 1 | 1 |
| 8 | 0.95 | 0 | 1 | 1 | 1 | 0 | 1 | 1 | 1 | 0 | 0 | 0 | 0 | 1 | 0 | 0 | 1 |
| 9 | 0.45 | 0 | 1 | 1 | 1 | 1 | 1 | 1 | 1 | 1 | 1 | 1 | 1 | 1 | 1 | 1 | 1 |
| Calibrated Value Using Word above | | 0.00 | 0.45 | 1.00 | 1.50 | 2.00 | 2.50 | 3.00 | 3.50 | 4.00 | 4.50 | 5.00 | 5.50 | 6.00 | 6.45 | 6.90 | 7.35 |

Fig. 3

| Input Control Words | | | | | |
|---|---|---|---|---|---|
| | | 0 | 0 | 0 | 0 |
| | | 1 | 1 | 1 | 1 |
| | | 1 | 1 | 1 | 1 |
| | | 0 | 0 | 0 | 0 |
| | Target Value | 3.00 | 3.00 | 3.00 | 3.00 |
| Device | Measured value | Calibration Words | | | |
| 1 | 1.00 | 0 | 0 | 1 | 1 |
| 2 | 0.90 | 0 | 1 | 0 | 0 |
| 3 | 1.05 | 1 | 1 | 1 | 1 |
| 4 | 1.10 | 0 | 0 | 0 | 0 |
| 5 | 0.85 | 0 | 0 | 1 | 0 |
| 6 | 0.90 | 1 | 0 | 0 | 0 |
| 7 | 1.00 | 1 | 0 | 0 | 0 |
| 8 | 0.95 | 0 | 0 | 1 | 1 |
| 9 | 0.45 | 0 | 0 | 0 | 0 |
| Calibrated Value Using Word above | | 3.00 | 3.00 | 3.00 | 3.00 |

Fig. 8

FLEXIBLE CONTROL SYSTEMS AND METHODS FOR DEVICE ARRAYS

PRIORITY CLAIM

The present application claims the benefit of U.S. Provisional Patent Application Ser. No. 62/459,575, filed Feb. 15, 2017, the disclosure of which is incorporated herein by reference in its entirety.

TECHNICAL FIELD

The subject matter disclosed herein relates generally to arrays of switchable devices. More particularly, the subject matter disclosed herein relates to systems and methods for controlling the actuation of switchable devices in such arrays.

BACKGROUND

Programmable capacitor arrays can be used for tuning the response of an electrical circuit by varying the capacitance value of the capacitor to correspondingly produce different behaviors. In many applications, the set value may need to be tightly controlled to meet system requirements and optimize overall performance. In general, however, although such capacitors are commonly built using a range of processes, all processes exhibit variations due to factors such as rates, chemistries, temperatures, and timing. As a result, substantially all programmable capacitors as built have a range of values (e.g., for maximum capacitance value, minimum capacitance value, capacitance step between set values). This range may be acceptable for some applications, but when a more precise response is required, it is desirable that variation in the capacitance values be minimized.

To address these issues, attempts have been made to reduce the variation in the manufacturing process, but raising performance standards generally requires either exerting more precise control over the production process or discarding components that fail to meet the higher standards. Both of these approaches increase the cost of producing the components. Alternatively, the capacitors can be designed to reduce the sensitivity of the device capacitance on the process variation, but doing so is not possible in all device configuration and/or applications. As a result, it would be desirable for the variation in the performance of devices to be reduced without dramatically increasing manufacturing costs or requiring component designs to be constrained to only those configurations that are less sensitive to process variability.

SUMMARY

In accordance with this disclosure, devices, systems, and methods for controlling an array of two-state elements are provided. In one aspect, a method for controlling an array of two-state elements that can be independently positioned in either first state or a second state is provided. The method can include receiving an input digital control word corresponding to a desired total combined activity of the array of two-state elements, addressing a location within a non-volatile memory based on the input digital control word, wherein the location stores one of a plurality of array control words corresponding to a predetermined combination of the two-state elements in the first state and in the second state, and applying the one of the plurality of array control words to the array of two-state elements to control the array to set the predetermined combination of the two-state elements in the first state and in the second state. The predetermined combination of the two-state elements in the first state and in the second state optimally achieves the desired total combined activity of the array of two-state elements.

In another aspect, a tunable component is provided in which a plurality of two-state elements are arranged in a functional array, wherein each of the two-state elements can be independently positioned in either a first state or a second state. A non-volatile memory in communication with the plurality of two-state elements is configured to receive an input digital control word that addresses a location within the non-volatile memory and to output one of a plurality of array control words stored at the location addressed within the memory to the plurality of two-state elements. In this configuration, the array control word sets a predetermined combination of the plurality of two-state elements to be in the first state and in the second state, wherein the predetermined combination of the plurality of two-state elements in the first state and in the second state optimally achieves a desired behavior of the array corresponding to the input digital control word.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which:

FIG. 3 is a chart illustrating a mapping of a set of input digital control words to corresponding array control words for a tunable component according to an embodiment of the presently disclosed subject matter;

FIG. 8 is a chart illustrating a mapping of a set of input digital control words to corresponding array control words for a tunable component according to an embodiment of the presently disclosed subject matter.

DETAILED DESCRIPTION

Rather than relying on controlling the production of the tunable devices to minimize the variation in performance and/or to minimize the impact of the variation, the present subject matter provides devices, systems, and methods that are designed to compensate for the variation through appropriate control that is more flexible than previous control circuits. In this way, more precise device response values can be available.

In this regard, in one aspect, the present subject matter provides a method for calibrating and/or controlling a tunable component, such as a tunable capacitor array (e.g., an array of RF switches each in communication with a fixed capacitor, an array of tunable RF-MEMS capacitors), by initially identifying optimal tuning settings among the possible combinations of activations of different elements of the tunable component for each tuning state of the component, which can lead to far tighter achievable tolerances. Stated otherwise, whereas conventional calibration systems and methods focus on the deviation of the output or performance of the elements of the tunable component from nominal performance in the aggregate (e.g., by selecting a single best fit for the array from a set of coarse tuning settings and fine tuning from the selected state), the present devices, systems, and methods identify different "calibration settings" for each tuning state of the tunable component. In some embodiments, such an array of tuning settings can be stored in a lookup table or similar algorithm that is configured to associate one or more different configurations for the tunable component with each desired tuning state.

Figure 1:
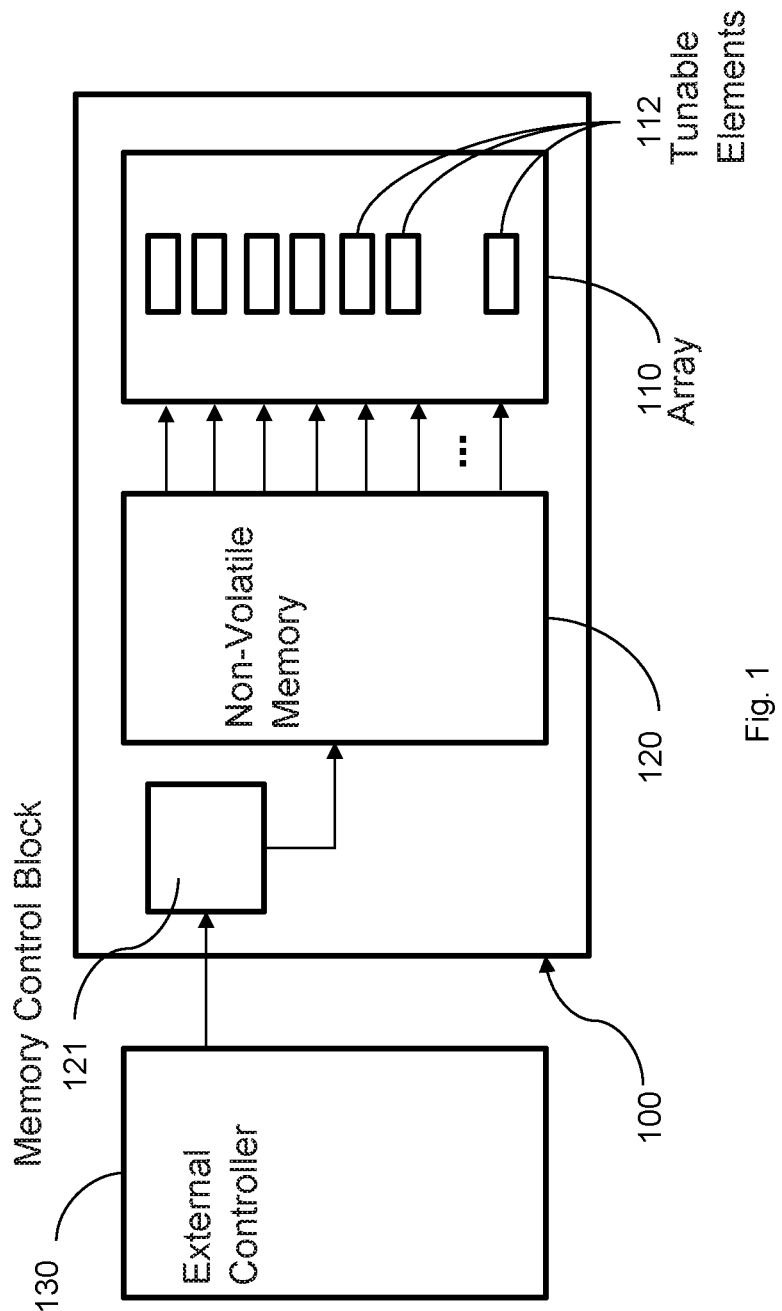
FIGS. 1 and 2 are schematic diagrams of tunable components according to embodiments of the presently disclosed subject matter.

Referring to an exemplary configuration illustrated in FIG. 1, a tunable component, generally designated 100, can include an array 110 containing a plurality of tunable elements 112. In some embodiments, for example, tunable elements 112 can be two-state elements that can be independently positioned in either a first state or a second state (e.g., an active state or an inactive state, a high-logic state or a low-logic state). A non-volatile memory 120 can be is integrated together with array 110 (e.g., mounted on a common substrate) and can be in communication with an external controller 130. In this way, the look-up table or similar algorithm that is used to store the individual tuning configurations that best achieve the desired behavior can thus be saved on-chip in memory 120.

In some embodiments, for such a tunable component 100, the present devices, systems, and methods are configured to identify, for each of a variety of different desired array behaviors, an optimal combination of elements that can be activated to substantially achieve the desired behavior. For example, where the two-state elements 112 are tunable capacitors that are each adjustable between a maximum capacitance in the first state and a minimum or zero capacitance in the second state, different combinations of the capacitors can be identified to achieve different values for a total array capacitance. The present devices, systems, and methods can further be configured to activate these combinations of elements (e.g., by providing associated array control words to the tunable array) in response to an associated input control word to thereby substantially achieve a desired response identified by the input control word. In this way, by individually adjusting the mapping of the input control word to the array control words that are used to activate the devices, the present subject matter can account for manufacturing and other variations in the individual device behavior in a precise way.

To enable this kind of control, the behavior of each element 112 in array 110 can be determined so that combined behavior for each of all possible element activation combinations can be precisely identified. In one embodiment, for example, where tunable component 100 includes an array of tunable capacitors (e.g., including micro-electro-mechanical beams that are movable to adjust the spacing between two capacitor electrodes), a capacitance value of each element in the array can be measured. For instance, for an array including 10 capacitors, 10 measurements are taken to individually characterize each element. With these individual measurements, the combined capacitance that can be realized by each possible combination of the capacitors is then calculated. Again, with respect to an example array containing 10 capacitors, there are 1024 possible combinations of activating the 10 elements. From these calculations, for each desired tuning setting of the array, one or more of the combinations (e.g. actuation of a particular set of beams) can be identified as providing sufficient accuracy to the desired value of a given tuning setting, and a correspondence between these combinations and the associated desired tuning setting can be established.

In one particular example illustrated in FIG. 3, an array of nine tunable capacitors is provided, with eight of the capacitors exhibiting varying deviations from a nominal capacitance value of 1.0, and one trimming capacitor having a measured deviation from a nominal capacitance value of 0.5. With this combination of elements, if a desired tuning range is between about 0.0 and about 7.5 with a desired step between tuning states of about 0.5, conventional tuning control systems may have trouble accounting for the manufacturing and other variations in the capacitances to achieve the desired values at each tuning setting. Instead, a best fit may be applied to generally achieve good results for many tuning states, but such an approach to calibration is unlikely to achieve an optimum result at every tuning state.

Figure 4A:
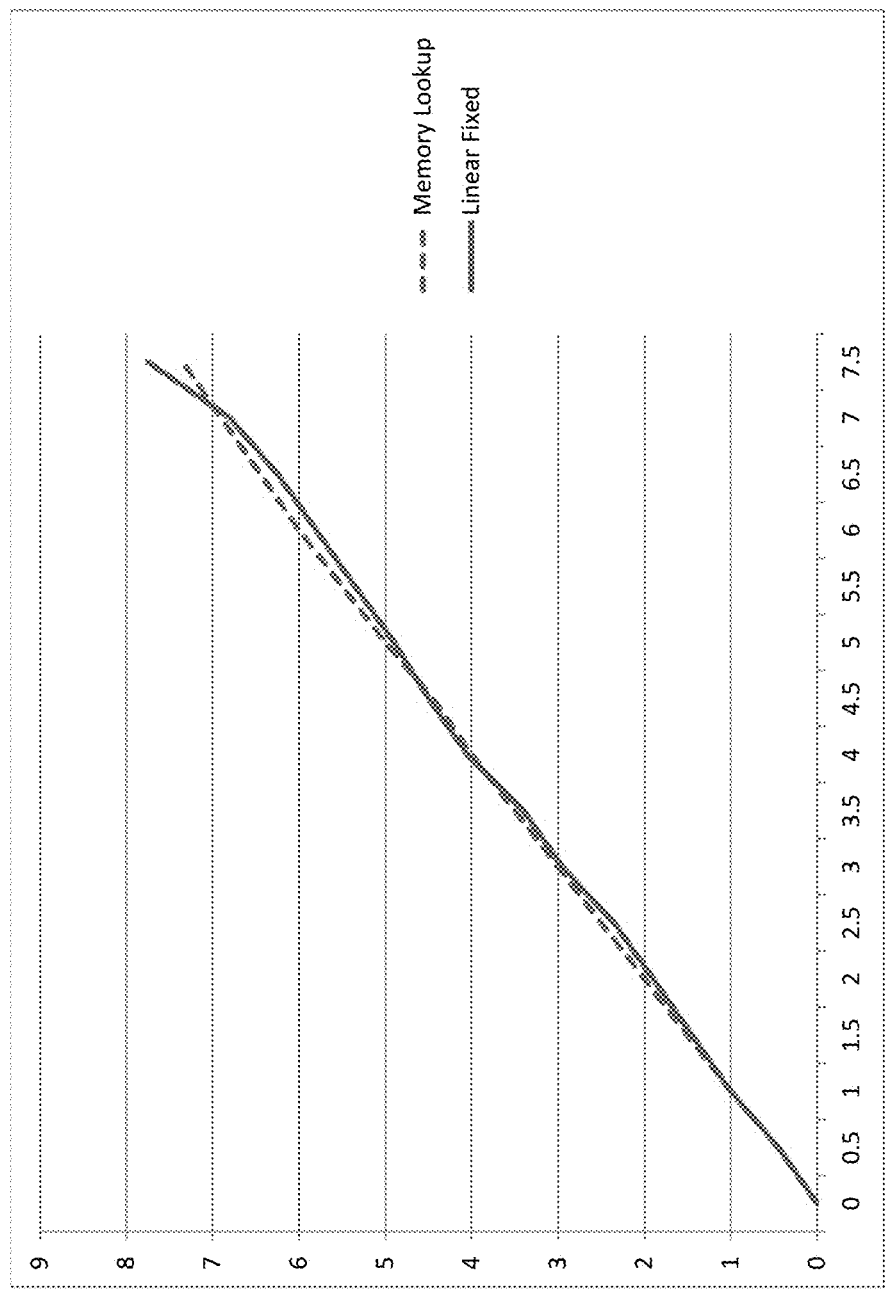
FIG. 4A is a graph that contrasts results from a linear approximation method of achieving desired total capacitor values of a tunable component to results of tuning using methods according to an embodiment of the presently disclosed subject matter.
Figure 4B:
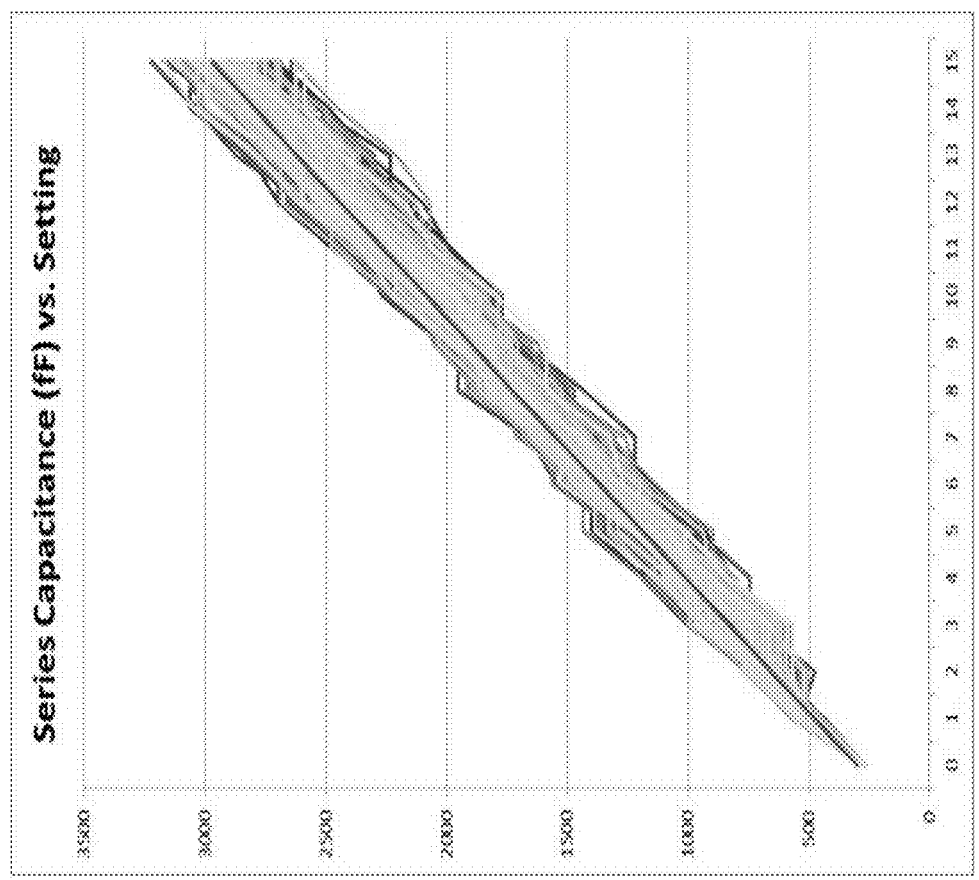
FIG. 4B is a graph illustrating the variation across parts for the linear approximation method.

For instance, FIGS. 4A and 4B illustrate linear approximation methods of calibrating an array of capacitors to achieve a range of desired total capacitance states. In such methods, the total tuning range of the die or bank is measured, and a programmed slope coefficient is applied to try to hit the target. For example, using the example array discussed above with respect to FIG. 3, the measured tuning range of a bank is 8.2 with a target value for all beams of 8.5. Thus, a multiplier of 1.037 would be applied to all input values to control the individual capacitor elements, and commonly a fixed activation order would be applied (i.e., elements 1-8 being turned on in sequence, with element 9 being the trimmer for half-step increments). To be accurate, all beams would have to have the same 'strength' on a given die and the die should have small enough resolution to avoid tuning glitches (e.g., since the impact of the scaling will be to turn on more or fewer beams to achieve the value). As shown in the plot of this "Linear Fixed" approach in FIG. 4A, however, the combination of the fixed-order activation and scaled truncation of the tuning values can result in values that can deviate significantly from a given target value, particularly at high values.

Further in this regard, FIG. 4B illustrates similar linear approximation methods applied to a range of different arrays. As shown in the overlaid plots, there can be wide variability at the maximum value because there are multiple banks on a die, but there is only one common calibration word, and individual beam variability causes each bank to have a different actual tuning range. This could be improved by having individual slope calibrations for each bank but, as shown in FIG. 4A, the result will still not be as accurate as the lookup approach disclosed herein. In addition, such a method can result in discontinuous tuning steps that are caused by not having fine enough tuning increments such that the slope sometimes yields the same control word for two different input words or very large tuning steps. Further in this regard, such a tuning approach can result in an overall noise/variability that is due to individual beam variation within the bank.

Figure 5:
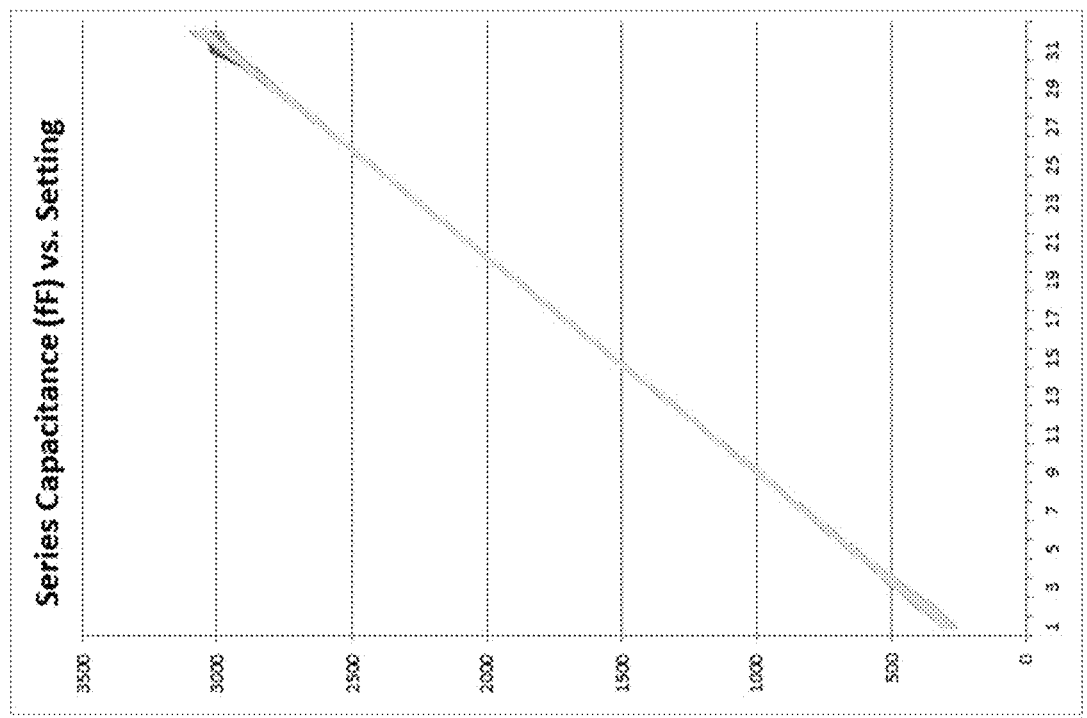
FIG. 5 is a graph illustrating the variation across parts using methods according to an embodiment of the presently disclosed subject matter.

According to the present subject matter, however, the total capacitance provided by each combination of the elements is calculated, and the device combination that most closely matches the desired total capacitance value at a given tuning step can be selected for that tuning step. Referring again to the example illustrated in FIG. 3, for a given input control word associated with one of the tuning steps (e.g., having 4 control bits as shown for achieving 16 specified tuning states), the preselected combination of elements can be activated to best achieve the desired total capacitance value as shown in the "Memory Lookup" plot in FIG. 4A. Similarly, FIG. 5 provides a series of plots showing the application of the present tuning systems and methods to a range of different arrays. In each case, the present systems and methods result in far greater precision in achieving optimal tuning settings. Referring to the example embodiments illustrated, this system may still deviate from the desired tuning at certain values, particularly at the upper and lower limits where fewer possible combinations provide less flexibility in selecting the optimal combination of elements. That being said, even if not perfect, this approach can better cope with random variation to produce far more accurate results for more tuning states than inflexible conventional sequences.

Furthermore, the above example shows that application of the present subject matter to a linear tuning curve, but due to the flexibility in independently assigning the capacitance for each control word, such high accuracy at each tuning setting can be provided to any of a variety of control schemes. For example, different tuning curves can provide different tuning sensitivity at different points of the curve. In some embodiments, instead of piecewise linear, the control scheme can implement a quadratic increase in capacitance, which would yield linear frequency tuning. In other embodiments, an exponential curve/relationship can provide fine control at a low capacitance end, whereas a linear curve/relationship can provide fine fractional control at a high capacitance end, and a parabolic curve/relationship can provide linear LC resonator tuning.

Figure 6:
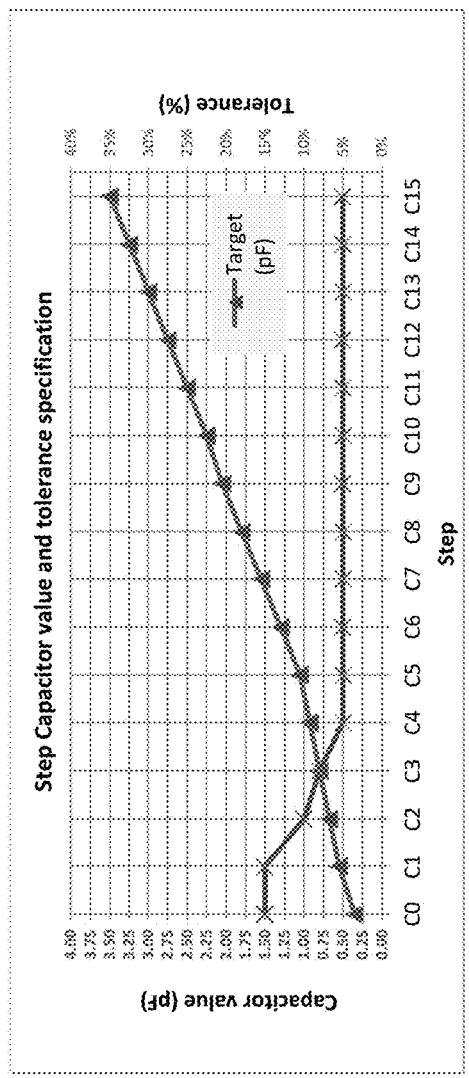
FIG. 6 is a graph illustrating incremental capacitor values and tolerances for an example tuning curve applied to a tunable component according to an embodiment of the presently disclosed subject matter.
Figure 7:
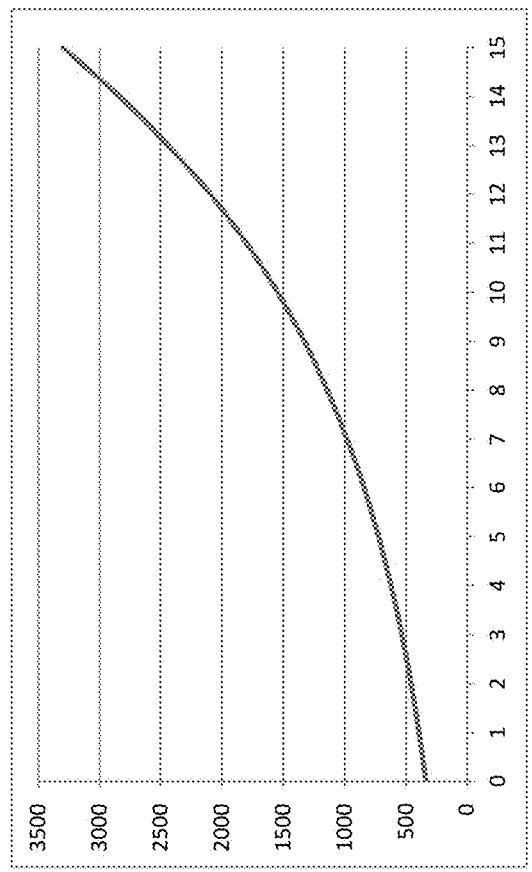
FIG. 7 is a graph illustrating incremental capacitor values for an example exponential tuning curve applied to a tunable component according to an embodiment of the presently disclosed subject matter.

In an embodiment illustrated in FIG. 6, for example, a two-step linear tuning scheme can provide higher resolution at low values while still providing a wide total tuning range. In other embodiments, an exponential tuning curve can be achieved, which can yield constant fractional step size. In one such configuration illustrated in FIG. 7, for example, 4 bits of control can be used to provide 16 tuning steps, with constant fractional tuning at each step. These and any of a variety of other tuning curves or patterns can be customized to provide the desired device response (e.g., exponential, square root, bi-linear, linear, logarithmic, arbitrary) over the range of tuning states. In fact, since the mapping from input to device behavior is controlled on an individual basis for each tuning setting, a wide range of tuning curves can be implemented including some that might not be called curves. As a result, the present subject matter provides a path by which devices can be addressed in any pattern.

Further in this regard, in some embodiments, rather than programming only one set of tuning settings corresponding to a single tuning curve into the present devices, systems, and methods, multiple sets of tuning settings can be identified and multiple different sets of array control words can be stored. In this way, any of a variety of different tuning curves can be implemented by the same devices and systems depending on the set of input digital control word that is provided. As a result, the present devices, systems, and methods can provide great flexibility to a wide range of applications of the tunable components, possibly on a customer-by-customer basis. Regardless of the control scheme applied, a tight distribution around the target value for each tuning state can be achieved by the individual determination of the optimal combination of elements for each state.

In addition, if the number of input bits is less than the number of logical devices, the present devices, systems, and methods can provide the flexibility to adjust the array performance based on other parameters (e.g. voltage for electrostatic actuation, frequency of operation for arrays including RF devices). In addition, in some embodiments, the number of settings can be more fully customized (e.g., from 2 to $2^N$, where N is the number of bits in the input control word), and logical groupings can be changed (e.g. control as single bank or two banks or more). Further, in some embodiments in which multiple tunable components are in communication with a common bus, the input digital control word can identify a serial bus address for which a given part responds. In other words, there can be certain control words for which only a given component would response (e.g., memory 120 will not change its outputs for every possible input word).

Alternatively or in addition, in some embodiments, multiple mappings for the same control word can be stored with a separate or combined index to address the specific mapping. For example, in some embodiments, where only a limited number of bits are used for tuning (e.g., 4 bits are used in the previous example), additional bits could be used to select different tuning curves or to select between nearly identical tuning curves using different devices to provide redundancy and/or enable greater device lifetime. In this way, multiple different mappings for the same (or similar) input control word can be stored in the memory, with each of the different states of the elements in the array associated with each mapping substantially achieving the desired state of the array of two-state elements. As illustrated in FIG. 8, for example, using the same example array discussed above with respect to FIG. 3, for a single given input control word (e.g., in this example, a control word associated with a target value of 3.00), multiple mappings to the devices in the array can be stored, with each combination of devices providing a substantially similar output. In some embodiments, mappings can be used in sequence to reduce the average usage of particular device elements. In some embodiments, for example, a counter can be used to automatically cycle through 1 of N different tuning configurations that each maps the given input digital control word to a different combination of the tunable elements. One example of such a rotating array control scheme is disclosed in U.S. Pat. No. 8,773,193, the disclosure of which is incorporated herein by reference in its entirety. Alternatively, in some embodiments, each mapping can be optimized for a different operational scenario (e.g., to account for differences in response due to different temperatures or other environmental conditions).

Regardless of the particular control scheme to be used, to implement such calibration, a non-volatile memory can be provided with the tunable component on which the plurality of array control words are stored, the plurality of array control words each corresponding to a predetermined combination of operating states of the array of elements. Even though the storage of individual element combinations associated with each tuning state can require that much more data be stored than conventional systems, these additional resources can be obtained through the ready availability of dense on-chip non-volatile memory. In some embodiments, the non-volatile memory is a one-time programmable (OTP) memory. In some embodiments, the OTP memory can be programmed at a final test of the array. In this way, the "calibration tables" can be loaded at test and shipped with the part, and then this calibration data can be utilized during part operation. Specifically, the plurality of array control words can be indexed on the non-volatile memory such that a correspondence is created between a given input digital control word that identifies a desired total combined activity (e.g., input either as a serial digital control word or a parallel digital control word) and the particular combination (or combinations) of tunable elements that are determined to optimally achieve the desired activity. In this way, instead of a real-time calculation or conversion of the input digital control word needing to be completed based on the input, the present devices, systems, and methods provide for a simple look-up in the memory of the predetermined optimal array configuration for a given input.

With such an arrangement, a method for controlling array 110 of elements 112 can involve receiving an input digital control word (e.g., from controller 130) corresponding to the desired total combined activity of array 110 of elements 112. As discussed above, memory 120 can be indexed by the input digital control word such that a location within non-volatile memory 120 can be addressed based on the input digital control word, wherein the location stores one of a plurality of array control words corresponding to a predetermined combination of the two-state elements in the first state and in the second state. In some embodiments, for example, memory 120 includes a memory control block 121 that is configured to receive the input digital control word (e.g., from controller 130 over a serial interface) and communicate with the appropriate location within memory 120 to address array 110. Such a memory control block 121 can be integrated with memory 120, or it can be provided as a separate component. In addition, as further discussed above, the mapping of the input control word to the resulting behavior on the chip can be completely configurable by the contents of the look-up table. Thus, array 110 can be controlled by applying the one of the plurality of array control words to array 110 of elements 112 to control the predetermined combination of elements 112 to be in the first state and in the second state, wherein the predetermined combination of elements 112 in the first state and in the second state optimally achieves the desired total combined activity of array 110.

Figure 2:
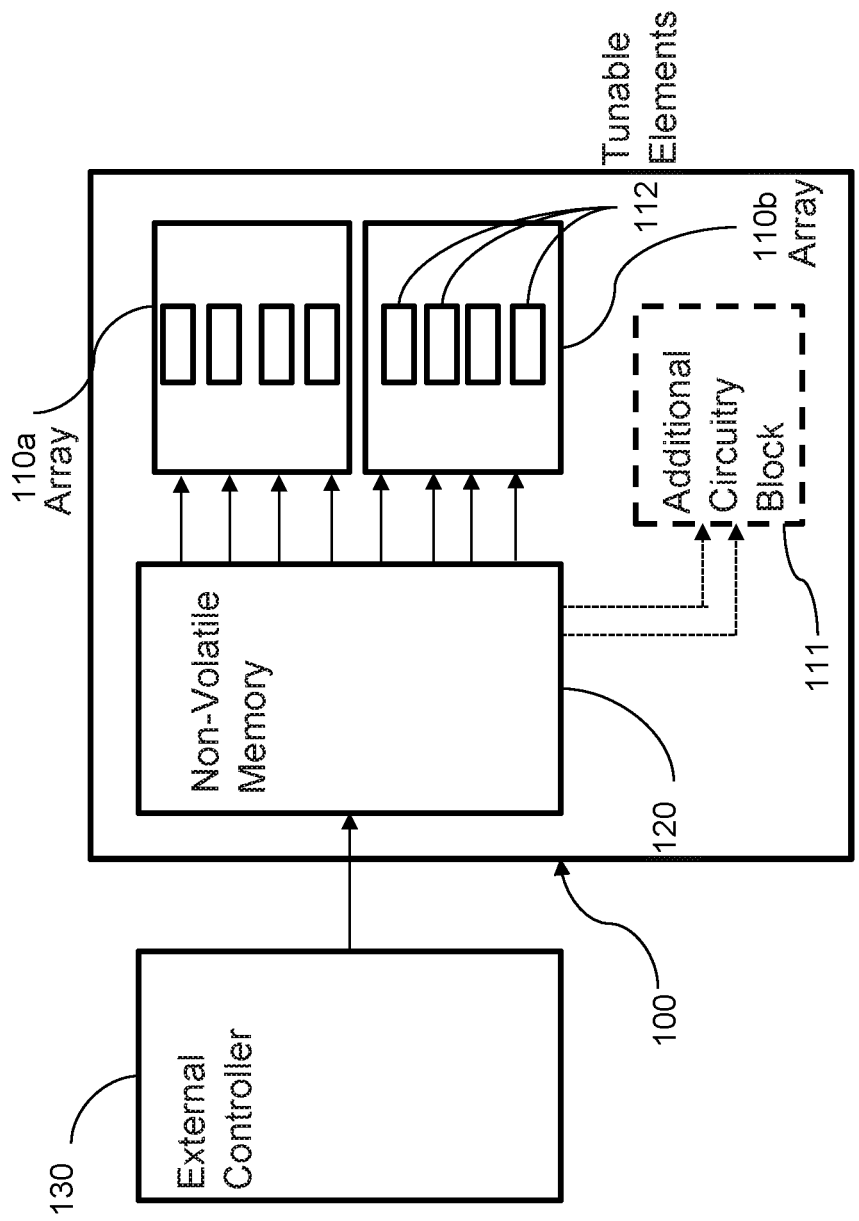

In some embodiments, such as is illustrated in FIG. 2, for example, array 110 can effectively be arranged in multiple logical groupings (e.g., split between a first sub-array 110a and a second sub-array 110b), and additional control bits can be used to identify which group of elements 112 is used to achieve the desired output. Alternatively or in addition, additional bits of control (e.g., where the number of input bits is less than the number of logical devices) can be used to adjust other operational parameters (e.g., to select an optimum charge pump voltage or frequency), such as by communicating with an additional circuitry block 111.

Furthermore, by having memory 120 integrated with array 110 (e.g., on a common substrate), the driver or controller (e.g., controller 130) in communication with tunable component 100 need not provide a specifically calibrated tuning signal to tunable component 100. Rather, the driver can provide a generic tuning word that represents a desired behavior (e.g., a desired total capacitance) to tunable component 100, and tunable component 100 can translate this generic tuning word into a predetermined combination of elements 112 within array 110 that optimally achieves the desired behavior.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for controlling an array of two-state elements that can be independently positioned in either a first state or a second state, the method comprising:
    programming a non-volatile memory, wherein programming the non-volatile memory comprises:
        measuring a device response in the first state and in the second state for each element in the array of two-state elements; and
        for each of a plurality of input digital control words, storing one of a plurality of array control words that sets a state of each element in the array of two-state elements to optimally achieve a desired total combined activity of the array of two-state elements;
    receiving an input digital control word corresponding to the desired total combined activity of the array of two-state elements;
    addressing a location within the non-volatile memory based on the input digital control word, wherein the location stores the one of the plurality of array control words corresponding to a predetermined combination of the two-state elements in a first state and in a second state; and
    applying the one of the plurality of array control words to the array of two-state elements to control the array to set the predetermined combination of the two-state elements to be in the first state and in the second state, wherein the predetermined combination of the two-state elements in the first state and in the second state optimally achieves the desired total combined activity of the array of two-state elements.

2. The method of claim 1, wherein receiving the input digital control word comprises receiving a serial digital control word.

3. The method of claim 1, wherein receiving the input digital control word comprises receiving a parallel digital control word.

4. The method of claim 1, wherein the non-volatile memory comprises a one-time programmable memory.

5. The method of claim 1, wherein addressing a location within the non-volatile memory comprises addressing one of a plurality of locations in the memory that are each associated with the desired total combined activity of the array of two-state elements, wherein different array control words corresponding to different states of the elements in the array are stored at the plurality of locations.

6. The method of claim 1, wherein programming the non-volatile memory comprises providing multiple different sets of array control words that provide different array behavior corresponding to multiple different sets of input digital control words; and
    wherein receiving the input digital control word comprises receiving additional address bits that identify one of the multiple different sets of array control words.

7. The method of claim 6, wherein the multiple different sets of array control words define multiple different tuning curves.

8. The method of claim 6, wherein the multiple different sets of array control words address discrete sub-arrays within the array of two-state elements.

9. The method of claim 1, wherein the two-state elements comprise tunable capacitors that are each switchable between a maximum capacitance in the first state and a minimum capacitance in the second state; and
wherein the desired behavior of the array of two-state elements comprises a desired total array capacitance.

10. A tunable component comprising:
a plurality of two-state elements arranged in a functional array, wherein each of the two-state elements can be independently positioned in either a first state or a second state; and
a non-volatile memory in communication with the plurality of two-state elements, wherein the non-volatile memory is configured to receive an input digital control word that addresses a location within the non-volatile memory and to output one array control word of a plurality of array control words stored at the location addressed within the memory to the plurality of two-state elements;
wherein the one array control word sets a predetermined combination of the plurality of two-state elements to be in the first state and in the second state, wherein the predetermined combination of the plurality of two-state elements in the first state and in the second state optimally achieves a total combined activity of the array corresponding to the input digital control word; and
wherein, for each of the plurality of array control words, the predetermined combination of the plurality of two-state elements to be in the first state and in the second state is selected based at least partially on a measured device response in the first state and in the second state for each element in the plurality of two-state elements.

11. The tunable component of claim 10, wherein the plurality of two-state elements comprises a plurality of RF switches.

12. The tunable component of claim 10, wherein the plurality of two-state elements comprises a plurality of RF-MEMS capacitors.

13. The tunable component of claim 10, wherein the non-volatile memory and the plurality of elements are on a common substrate.

* * * * *